United States Patent [19]
Hillmer

[11] Patent Number: 5,834,158
[45] Date of Patent: Nov. 10, 1998

[54] METHOD FOR THE OPTIMUM UTILIZATION OF BASE MATERIAL IN THE MANUFACTURE OF OPTOELECTRONIC COMPONENTS WITH VARIABLE-PERIOD GRATING

[75] Inventor: Hartmut Hillmer, Darmstadt, Germany

[73] Assignee: Deutsche Telekom AG, Bonn, Germany

[21] Appl. No.: 655,502

[22] Filed: May 30, 1996

[30] Foreign Application Priority Data

May 30, 1995 [DE] Germany ................. 195 20 819.6

[51] Int. Cl.$^6$ ................. G03C 5/00; G02B 6/34
[52] U.S. Cl. ................. 430/296; 430/5; 385/37
[58] Field of Search ................. 430/296, 312, 430/5; 359/573; 385/10, 37

[56] References Cited

U.S. PATENT DOCUMENTS

| | | | |
|---|---|---|---|
| 5,052,015 | 9/1991 | Ackerman et al. | 372/96 |
| 5,197,016 | 3/1993 | Sugimoto et al. | 364/490 |
| 5,364,718 | 11/1994 | Oae et al. | 430/5 |
| 5,526,449 | 6/1996 | Meade et al. | 385/14 |

FOREIGN PATENT DOCUMENTS

| | | |
|---|---|---|
| 0 641 053 | 3/1995 | European Pat. Off. . |
| 647 867 | 4/1995 | European Pat. Off. . |
| 27 27 190 | 12/1977 | Germany . |
| 34 26 703 | 1/1986 | Germany . |
| 36 33 454 | 4/1987 | Germany . |
| 36 43 361 | 6/1987 | Germany . |
| 42 33 500 | 4/1994 | Germany . |

OTHER PUBLICATIONS

H. Hilmer, et al., "Ultrahigh resolution chirped distributed feedback gratings fabricated by electron–beam lithography using bent waveguides for low–cost photonic components," 8257b Journal of Vacuum Science & Technology B 13(1995) Nov./Dec., No. 6, pp. 2853–2858.

Nakao et al., "Distributed Feedback Laser Arrays Fabricated by Synchrotron Orbital Radiation Lithography," 8272 IEEE Journal on Selected Areas in Communications 8(1990) Aug., No. 6, pp. 1178–1182.

Okai et al., "Corrugation–Pitch Modulated MQW–DFB Lasers with Narrow Spectral Linewidth," 8106 IEEE Journal of Quantum Electronics 27(1991) Jun., No. 6, 1767–1772.

Ohki et al., "Fabrication of Grating Patterns by E–beam lithography," 8226 Microelectronic Engineering 9(1989) May, Nos. 1–4, pp. 235–238.

Brükner et al., "Performance of Electron Beam Written Dielectric Waveguide Grating Filters Considering Fabrication Tolerances," 8177 Journal of Optical Communications 14(1993) Feb., No. 1, pp. 18–24.

Hillmer, et al., "Novel tunable semiconductor lasers using continuously chirped distributed feedback gratings with ultra-high spatial precision," 320 Applied Physics Letters 65(1994) 24 Oct., No. 17, pp. 2130–2132.

de Chambost, et al., "Experimental results from fast electron pattern generator: A variable shaped beam machine," J. Vac. Sci. Technol. B4(1), Jan./Feb. 1986, pp. 73–77.

Zhang et al., "Linearly and nonlinearly chirped Bragg gratings fabricated on curved fibers," Optics Letters/Vol. 20, No. 10/May 15, 1995, pp. 1122–1124.

Tsang et al., "Control of Lasing Wavelength in Distributed Feedback Lasers by Angling the Active Stripe with Respect to the Grating," IEEE Photonics Technology Letters, vol. 5, No. 9, Sep. 1993, pp. 978–980.

Hillmer et al., "Chirped Gratings for DFB Laser Diodes Using Bent Waveguides," IEEE Photonics Technology Letters, vol. 5, No. 1, Jan. 1993.

Hillmer et al., "Continuously distributed phase shifts in chirped DFB lasers using bent waveguides," Electronics Letters, 1st Sep. 1994, vol. 30, No. 18, pp. 1483–1484.

Hillmer et al., "Novel tunable semiconductor lasers using continuously chirped distributed feedback gratings with ultrahigh spatial precision," Appl. Phys. Lett. 65 (17), 24 Oct. 1994, pp. 2130–2132.

Okai, et al., "Corrugation Pitch Modulated MQW–DFB Lasers With Narrow Spectral Line Width," IEEE J. Quantum Electronics, Jun. 1991, vol. 27, No. 6, pp. 1767–1771.

Tsang, et al., "Control Of Lasing Wavelength . . . To the Grating," Sep. 1993, IEEE Photonics Tech. Letter, vol. 5, No. 7, pp. 978–980.

Hillmer et al., Novel Tunable Semiconductor Lasers . . . Spatial Precision, Appl. Phys. Lett. 65 (17) Oct. 24, 1994, pp. 2130–2132.

Hiller et al., "Continuously Distributed Phase Shifts in Chirped DFB Lasers Using Bent Waveguides," vol. 30, No. 18, Sep. 1, 1994, pp. 1483–1484.

Ishii et al., Super Structure Grating (SSG) For Broadly Tunable DBR Lasers, IEEE PhotonicsTech. Letters, vol. 4, No. 4, Apr. 1993, pp. 393–395.

*Primary Examiner*—Janet C. Baxter
*Assistant Examiner*—Rosemary Ashton
*Attorney, Agent, or Firm*—Keyon & Keyon

[57] ABSTRACT

Disclosed is a method for the optimum utilization of disk-shaped base material in the manufacture of optoelectronic components with variable-period grating. The method helps avoid material losses by arranging optoelectronic components on a disk-shaped base material in an optimum manner and is based on obtaining variants of nominally identical individual component patterns by mathematical rotation and mirroring, forming a unit cell through shifting of the individual component pattern variants, and reproducing the unit cell in the x and y directions until the active surface of the mask or the entire surface of the disk-shaped base material is tightly covered. The method may be used for the manufacture of photonic components based on DFB, DBR, or sampled grating structures.

20 Claims, 16 Drawing Sheets

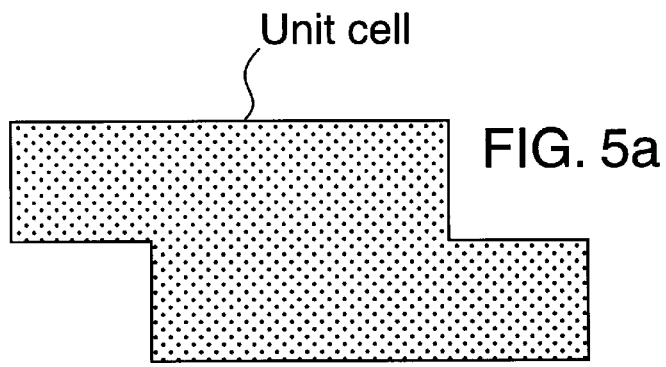
FIG. 5a
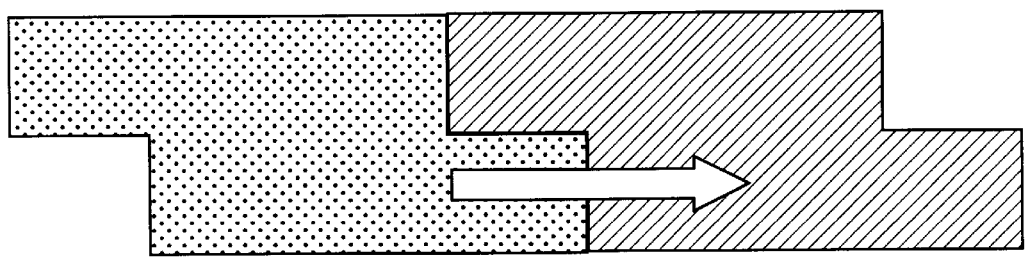
FIG. 5b
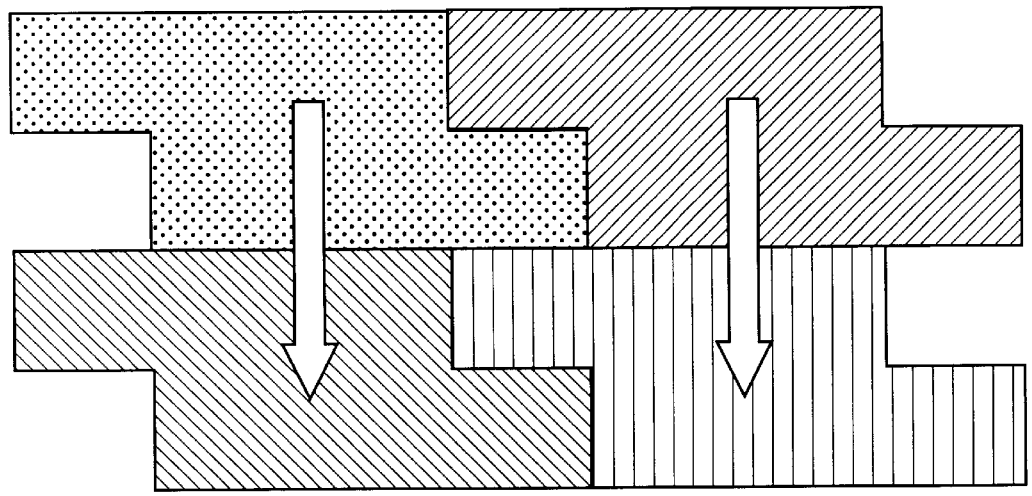
FIG. 5c
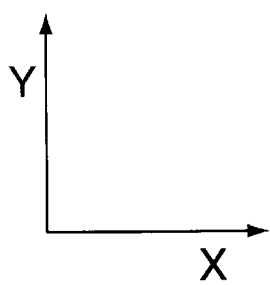

METHOD FOR THE OPTIMUM UTILIZATION OF BASE MATERIAL IN THE MANUFACTURE OF OPTOELECTRONIC COMPONENTS WITH VARIABLE-PERIOD GRATING

FIELD OF THE INVENTION

The present invention relates to the manufacture of optoelectronic components on a base material, and more particularly to a method of optimizing the use of the base material on which the optoelectronic components are manufactured.

RELATED BACKGROUND

The following papers are related to the present invention and comprise background material:

1) Abrupt changes in the corrugation period in the longitudinal direction of the component are known from the literature. With the self-interference method, a greater corrugation period is achieved in the central section of the laser resonator than in the lateral sections, e.g., as in M. Okai et al., IEEE J. Quantum Electron, 27, 1767 (1991). However, no continuous variation of the corrugation period is achieved with this structure.

2) Electron-beam lithography (EL) allows the grating period to be varied axially within certain limits. EL is, however, a complicated and low-efficiency process. Furthermore, the EL writing time is very expensive. EL allows DFB gratings to be manufactured with a small number of different sections, within which the grating period is constant, while it is different from one section to another, as used by H. Ishii et al., IEEE J. Quant. Electron. 5, 613 (1993). No continuous variations of the grating period in space can be achieved.

3) Using obliquely positioned waveguides on homogeneous DFB gratings, the grating period in the waveguide can be set to a value that is different from that of the original DFB grating, as for example in H. Shoji, German Patent 3643361 A1, H 01 S 3/098-C (1987), as well as W. T. Tsang, European Patent 0641053A1 and W. T. Tsang et al., IEEE Photon. Technol. Lett. PTL-5, 978 (1993).

4) When waveguides run in curved shapes on homogeneous DFB grating fields, grates with axially varied grating periods can be defined, as, for example, explained in the following papers: D. A. Ackerman et al., U.S. Pat. No. 5,052,015 (1991); H. Hillmer et al. Appl. Phys. Lett. 65, 2130 (1994), H. Hillmer et al. Electron. Lett. 30, 1483 (1994), H. Hillmer German Patent 42 33 500. A1.

SUMMARY OF THE PRESENT INVENTION

The present invention may be used in photonic components based on DFB (Distributed FeedBack) grating, DBR (Distributed Bragg Reflector) grating, or sampled grating structures. The material can be made, for example, from the class of semiconductors, glasses, or plastics. The present invention allows optoelectronic components having feedback gratings with axially continuously variable corrugation periods to be manufactured with a high yield. The method is applicable regardless of the special shapes of different photonic components when these are based on optical feedback gratings and the wave conductance of the optical waveguide is sufficiently high. The present invention allows lasers, laser amplifiers, filters, couplers, switches, wavelength converters, multiplexers, demultiplexers, and detectors, for example, to be economically manufactured.

The object of the solution according to the invention is to manufacture components containing gratings with variable grating periods, using a cost-effective method. Such a method should be based on the most economical and efficient technologies possible and use resources such as semiconductor materials sparingly, so that the highest possible component yield is obtained. These are components with waveguides having characteristic curvatures either, firstly, on perfectly homogeneous grating fields or, secondly, on homogeneous grating fields interrupted by quasi-abrupt phase shifts, or, thirdly, on periodically interrupted grating fields. The waveguide curvature allows an axial variation of the grating period to be set to selectively affect certain component parameters. The special mathematical form of the curvature allows certain component-characteristics to be customized. A feature of the solution of the present invention is the compact arrangement of the individual components on the disk-shaped base material with the purpose of minimizing the material losses occurring in the conventional processes. These are predominantly material losses occurring due to the selective use of lateral wave overlap or through the edge effects occurring during processing (proximity effects).

The solution according to the present invention can be used on many types of material available predominantly as disk-shaped base material. These include, for example, inorganic semiconductors, organic semiconductors, polymers, organic glasses, inorganic glasses, inorganic dielectric materials (e.g., $LiNbO_3$), crystalline solids, polycrystalline solids, and amorphous solids.

In the following description, the principle of the process according to the present invention is explained using a semiconductor component. A wafer is defined either as a pure substrate material or a heterostructure including the substrate and at least one other material layer. Normally a plurality of materials with different electronic and optical characteristics are arranged in successive layers on the substrate. The curvatures illustrated in the examples of the embodiments are shown greatly exaggerated for the sake of clarity, i.e., the scaling in the x and y directions are different (the y axis is represented considerably elongated). The shape of the waveguide curvature is directly related to the desired variation of the DFB grating period in the axial direction, but it must also comply with an important secondary condition, which rules out excessive waveguide curvatures to avoid unnecessarily high curvature losses.

The method according to the invention also can be used for simultaneously producing at least two components of different dimensions and different waveguide paths on a wafer. In that case the most suitable individual component pattern is selected. Then the individual cell can include at least two different individual component patterns. If the continuity of the waveguide is interrupted at least one point, the waveguide offset is still less than $\frac{1}{20}$ of the lateral waveguide width. If the differentiability of the waveguide is interrupted in at least one case, the resulting angular offset is still less than 1°.

Furthermore, when the unit cell is reproduced on the mask, the unit cell can be reproduced at least once by rotation around its axis. The unit cell is preferably composed of individual component patterns so that the lateral position $y_1$ of the waveguide on the left edge of the unit cell is equal to the lateral position $y_2$ of the waveguide on the right edge of the unit cell. However, the lateral position $y_1$ of the waveguide on the left edge of the unit cell may also be different from the lateral position $y_2$ of the waveguide on the right edge of the unit cell. The following examples show the procedure in such a case.

BRIEF DESCRIPTION OF THE DRAWINGS

The operating principle of the solutions according to the present invention is explained in detail using a few examples of the following embodiment:

FIGS. 5a, 5b and 5c show examples of symmetry operations used on the unit cell shown in FIG. 3 for tightly covering the wafer surface with components.

DETAILED DESCRIPTION

Figure 1A:
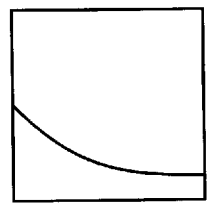
FIG. 1a shows an individual component.
Figure 1B:
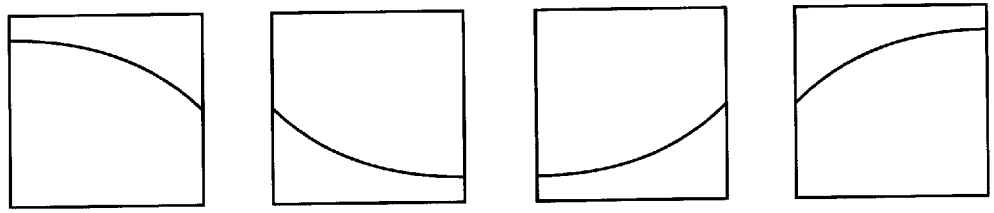
FIG. 1b shows the creation of a unit cell by adding together rotated and mirrored individual components.

The operating principle of the method according to the present invention is explained in detail using the example of the manufacture of a lithography mask set. When using curved waveguides in optoelectronic components, the exit angle and the lateral position of the waveguide on the left and right edges of the individual component are in general not identical, as shown in FIG. 1a. Therefore this component cannot be manufactured with the usual process without leaving numerous areas of the wafer unused or without some components becoming unusable due to the separation of the wafer, causing them to be scrapped after the process. In such a case, the number of intact components, which can be produced per unit surface area of the base material is strongly reduced, which increases the unit price of the component. FIG. 1b shows the basic principle of a method making it possible to largely avoid these unused surfaces.

Figure 1C:
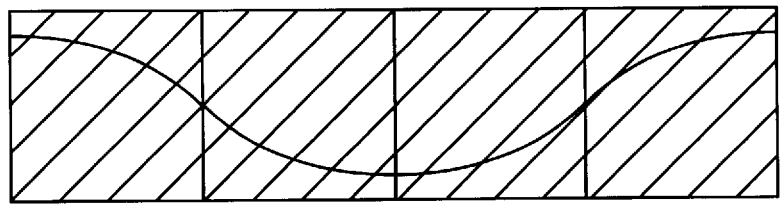
FIG. 1c shows the unit cell.
Figure 1D:
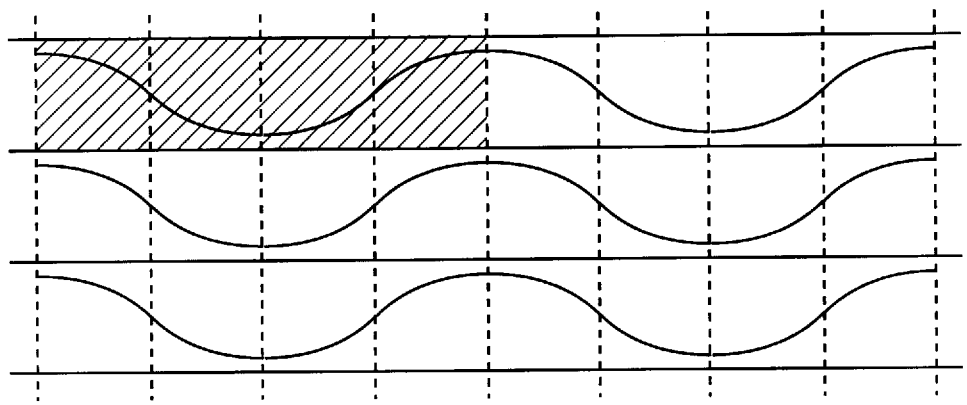
FIG. 1d shows the surface of the wafer comprised of several unit cells.
Figure 2:
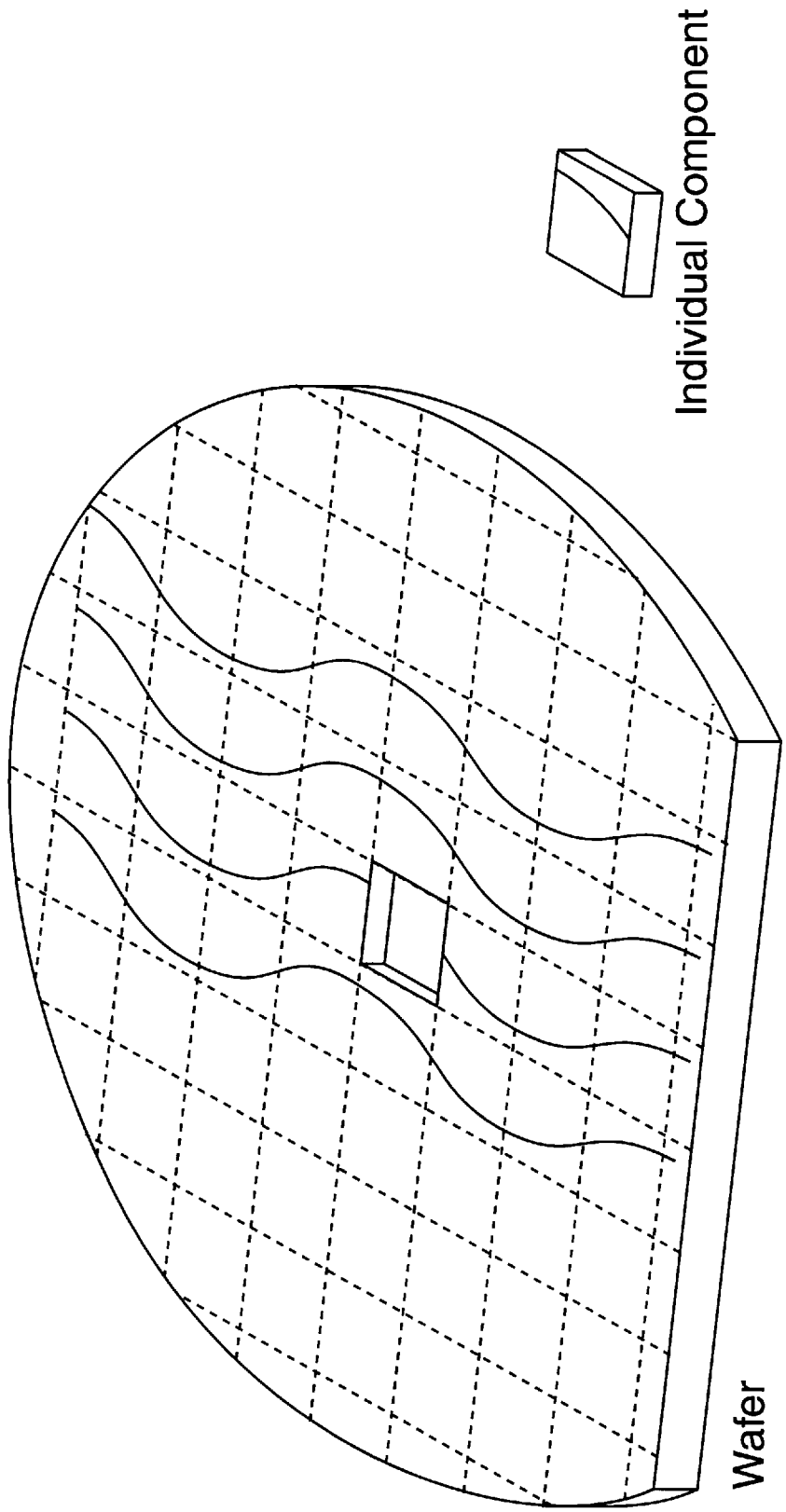
FIG. 2 shows the perspective view of a wafer surface. Example of the compact arrangement of components with curved waveguides.

Initially, further geometrical variants of the individual component patterns with nominally the same electrical and optical characteristics are formed by mathematically rotating the surface structure of the individual component 180° around an axis perpendicular to the mask surface, as well as by mathematically mirroring it in relation to axes running parallel to the boundaries of the individual components. From the variants of individual component patterns thus obtained, a unit cell is formed (FIG. 1c) using a computer program based on shifting the variants of the individual component pattern in the x and y directions. The decisive criterion here is that the mathematical waveguide function is continuous and differentiable on the component boundaries (dashed lines). In other words, the waveguides of neighboring components must fit with one another, so that a pass-through waveguide structure is obtained over the entire unit cell. Continuity and differentiability are required in order to avoid unnecessary optical losses in sharp bends or lateral offsets of the waveguide. By repeatedly shifting and tightly fitting the unit cells obtained according to the surface provided by the wafer, using a computer program, a surface structure composed of unit cells is obtained, which tightly covers the surface of the wafer (FIG. 1d and FIG. 2). By applying the method of the present invention consecutively to the design of all the masks of a mask set, a geometrically more consistent mask set is obtained for the lithographic manufacture of optoelectronic components, which utilizes the available surface of the wafer in an optimum manner.

Figure 3:
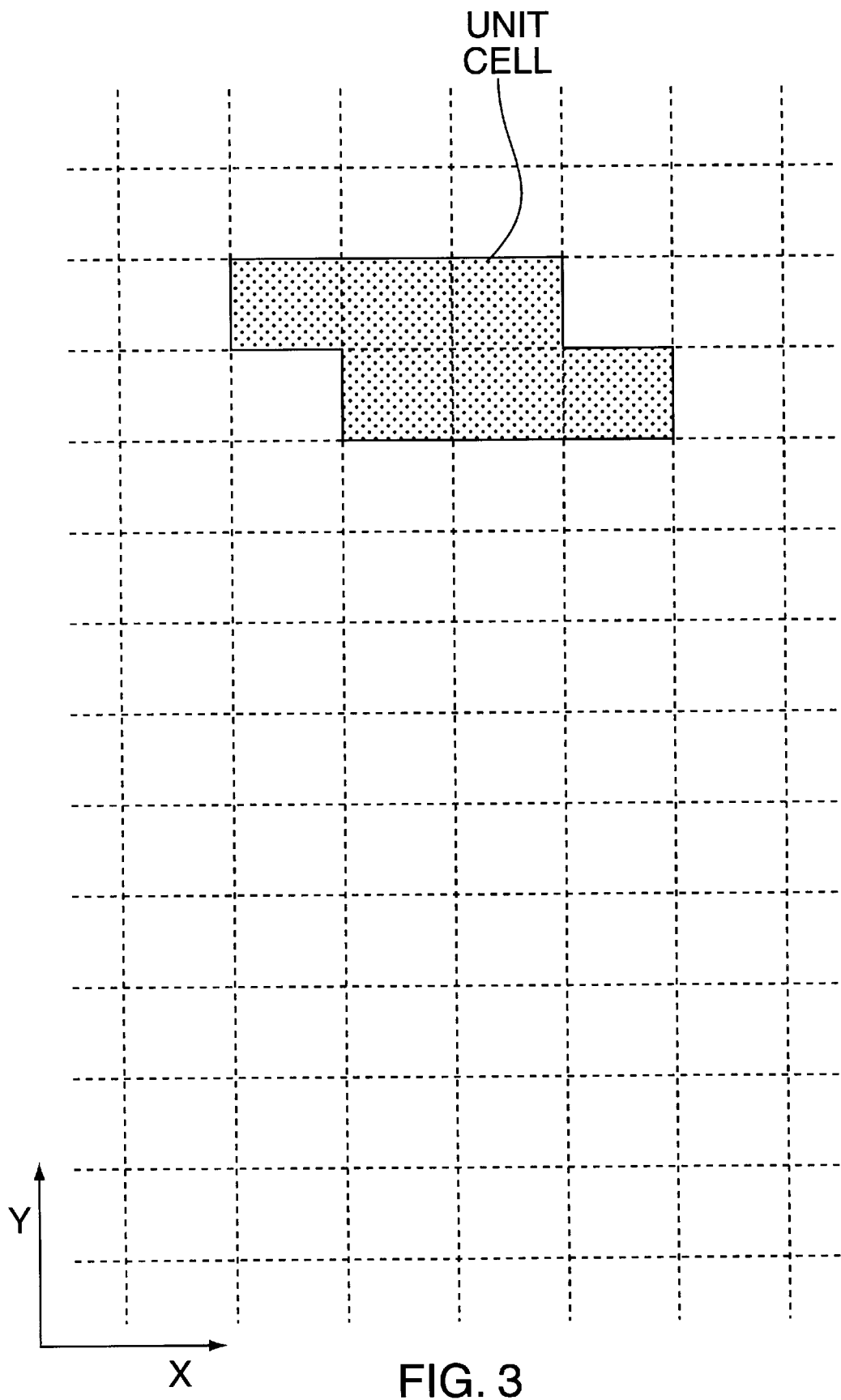
FIG. 3 shows a unit cell (dotted shading) including, in this example, of six individual components. The dashed lines denote the boundaries of the individual components.
Figure 4:
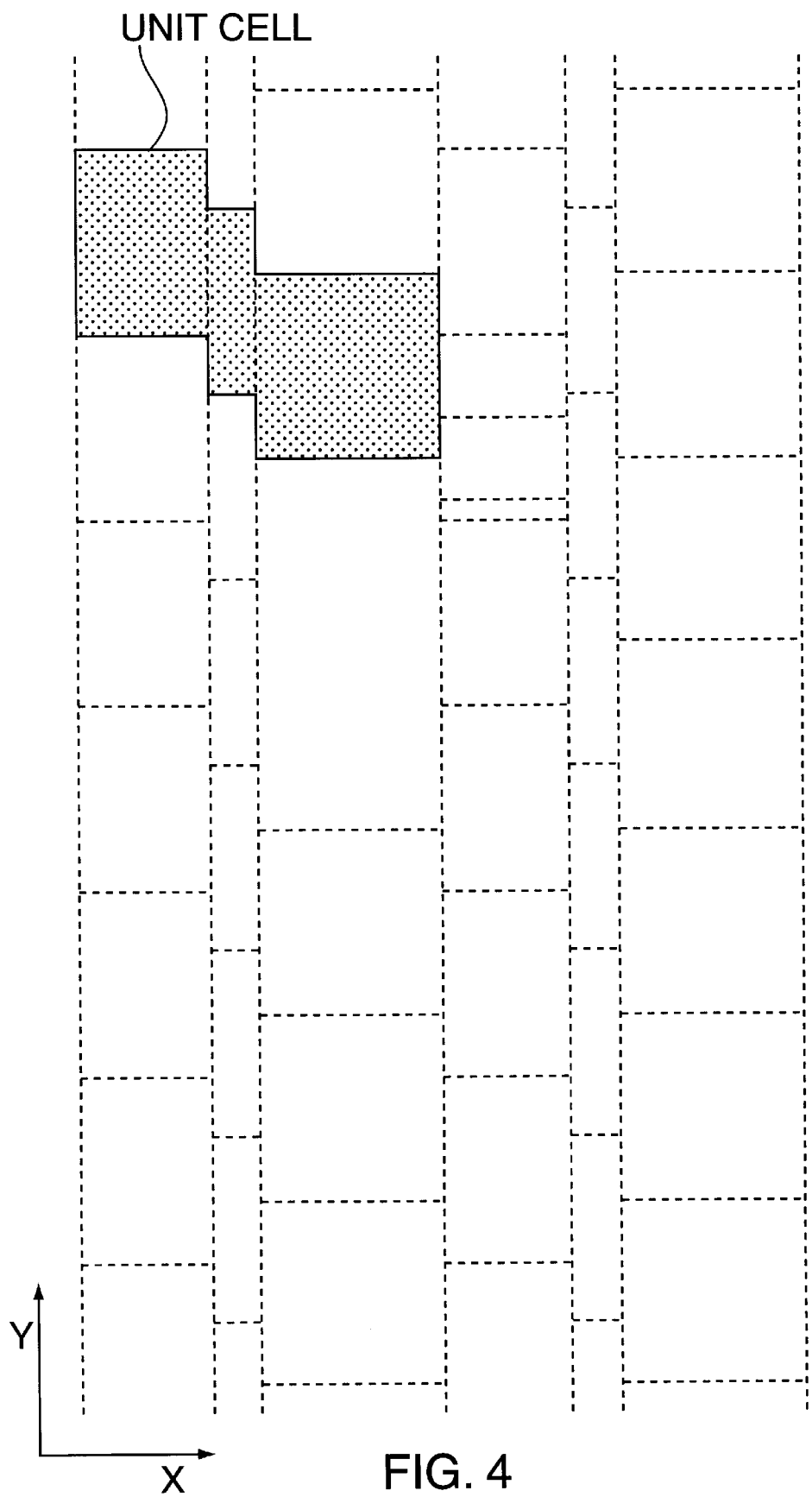
FIG. 4 shows a unit cell (dotted shading), including, in this example, of three individual components. The dashed lines denote the boundaries of the individual components.
Figure 6A:
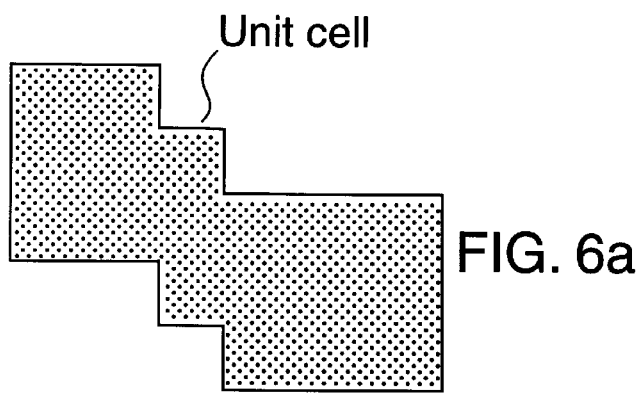
FIGS. 6a, 6b and 6c show examples of symmetry operations used on the unit cell shown in FIG. 4 for tightly covering the wafer surface with components.
Figure 6B:
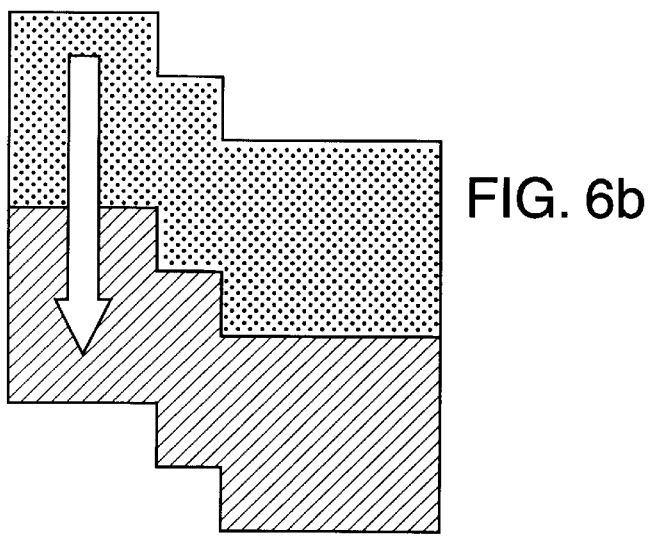
Figure 6C:
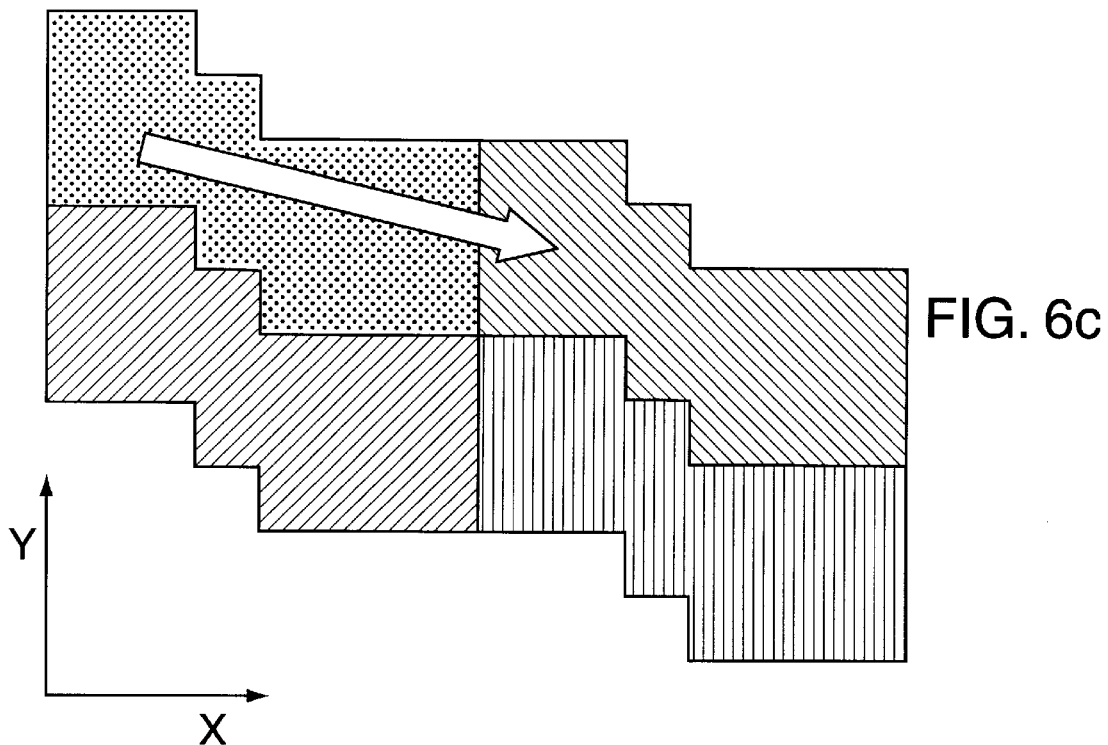

The examples given are based on DFB gratings, for which the grating extends over the entire component in the longitudinal direction. FIGS. 3–6 show examples of possible geometric shapes of the unit cells, as well as the required shifting operations of the unit cells for tight coverage of the wafer surface. The dashed lines denote the component boundaries. The wafer is split or etched along these lines after the completion of the processing operations, i.e., the individual components are separated. Let us assume that the wafer surface is identical to the xy plane. FIGS. 3 and 4 show that the unit cells whose surfaces are shown with dotted shading form different shapes and may contain a plurality of components. The individual components have the same dimensions in FIG. 3 and different dimensions in FIG. 4. FIG. 4 shows that when the individual components are separated by splitting, a split in the y direction must be done first, followed by a split in the x direction. When the individual components are separated by etching, this separation can be conveniently done simultaneously in both directions. FIGS. 5a, 5b and 5c and FIGS. 6a, 6b and 6c show the shifting and fitting of unit cells of FIGS. 3 and 4 to tightly cover the xy plane (wafer surface).

Figure 7:
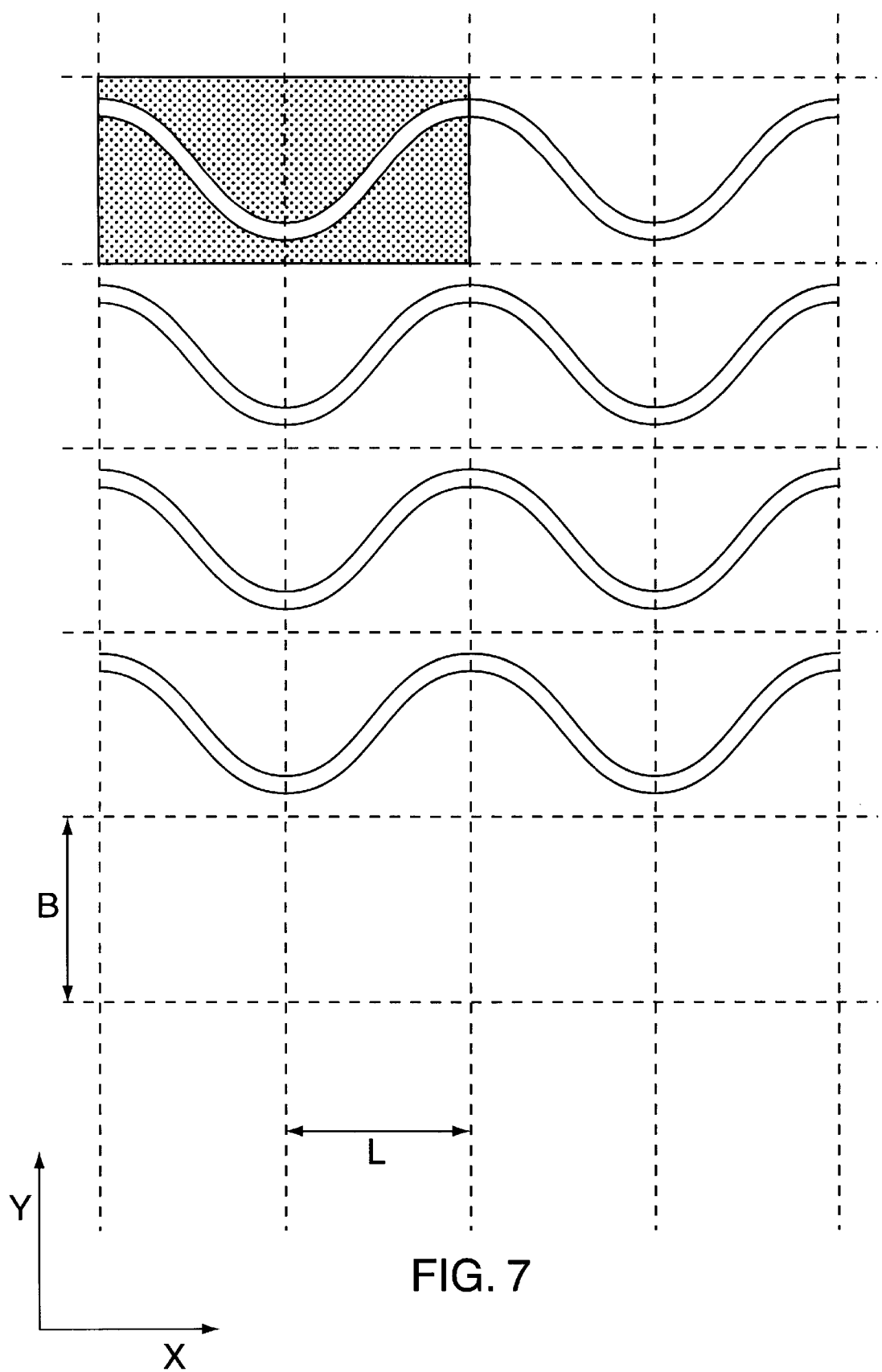
FIG. 7 shows an example of the shape of waveguide curvatures on a wafer section. B and L are the external dimensions of the individual component.

The example of FIG. 7 shows that the mathematical waveguide function is continuous and differentiable along the component boundaries (dashed lines). The unit cell here contains two physically identical components. The shift vectors are, for example, (x,y)=(2L,0) or (x,y)=(0, −B) or (x,y)=(2L, −B).

Figure 8:
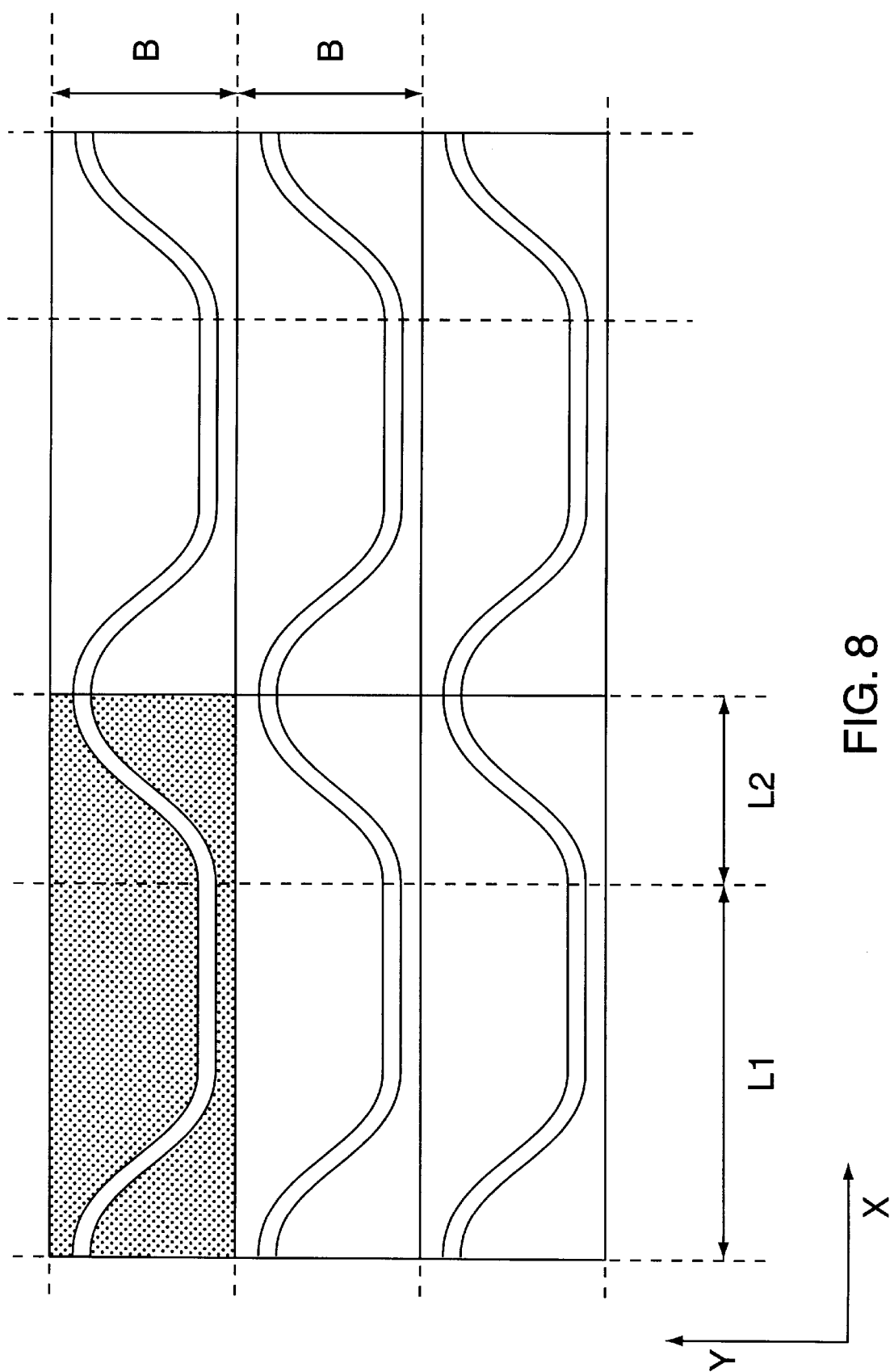
FIG. 8 shows an example of the shape of waveguide curvatures on a wafer section. B and $L_1$ are the external dimensions of the first individual component; B and $L_1$ are the external dimensions of the second individual component.

FIG. 8 shows an example with two different components for each unit cell. The shift vectors are, for example, (x,y)=($L_1+L_2$, 0) or (x,y)=(0, −B) or (x,y)=($L_1+L_2$, −B). In the examples of FIGS. 7 and 8, the components can be separated by splitting in either the x or the y direction first.

Figure 9:
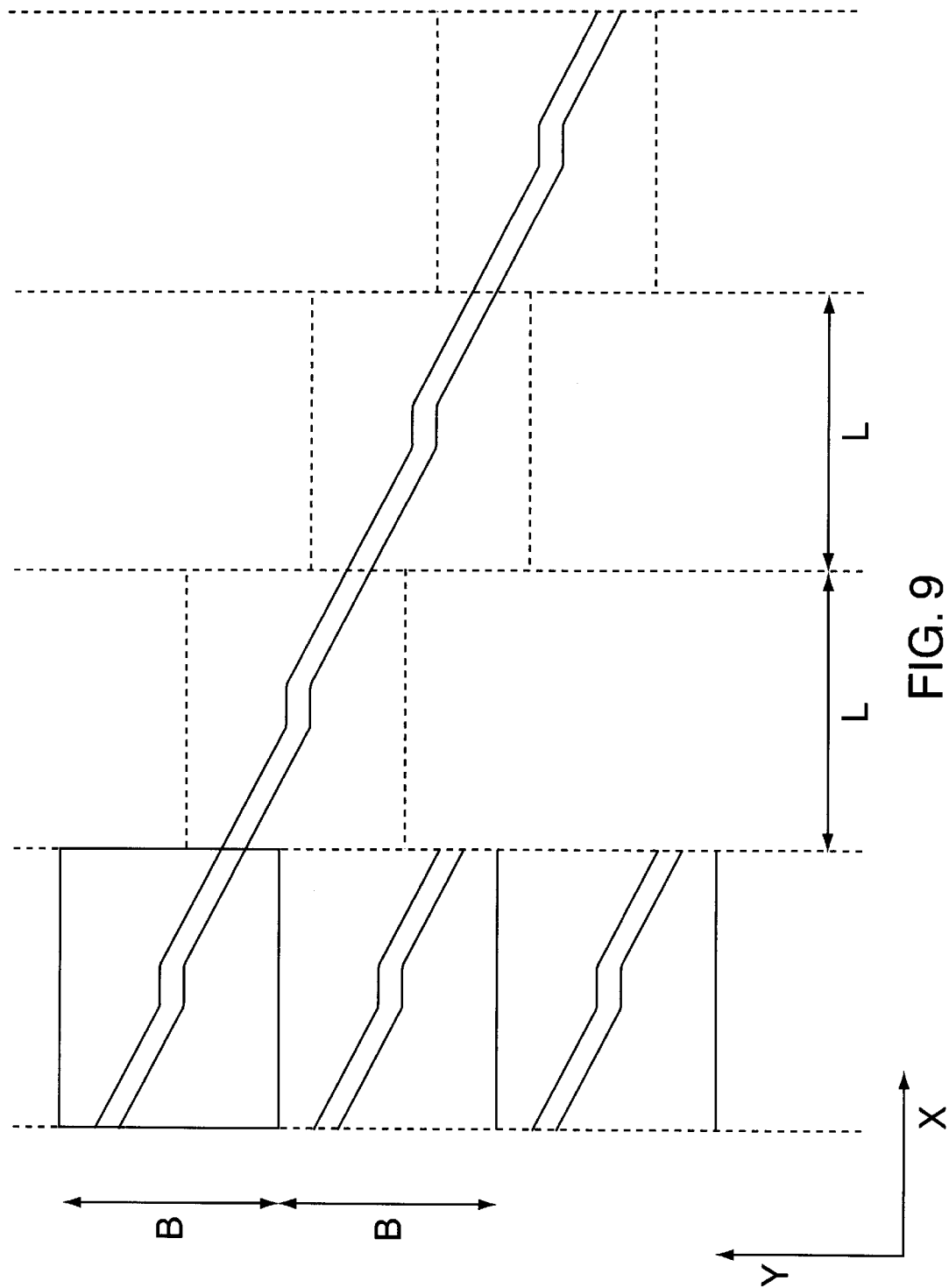
FIG. 9 shows an example of the shape of waveguide curvatures on a wafer section. B and L are the external dimensions of the individual component.
Figure 10:
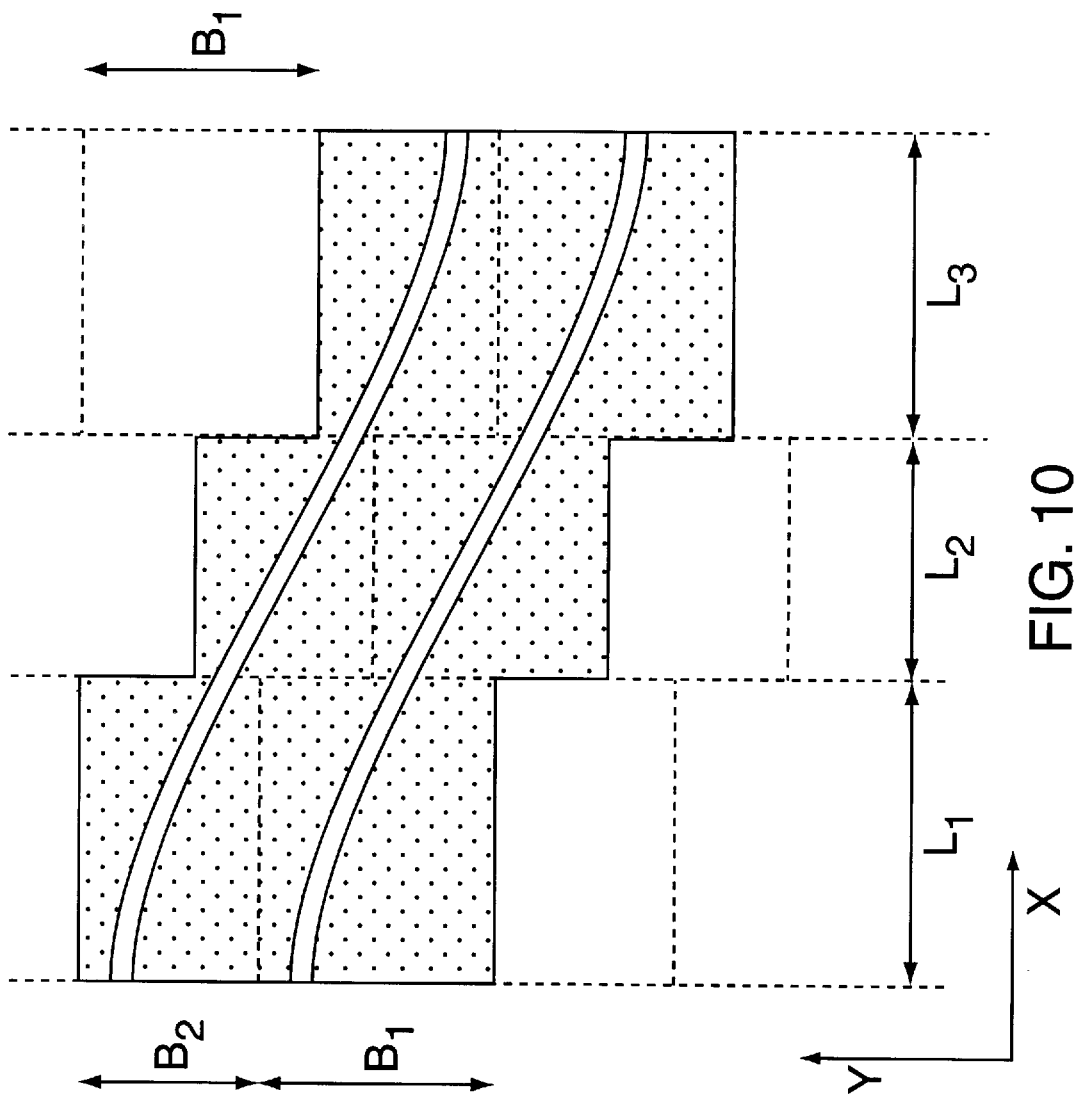
FIG. 10 shows an example of a unit cell containing six components, some of which are offset by degrees. The mathematical waveguide function is continuous and differentiable along the component boundaries (dashed lines)
Figure 11:
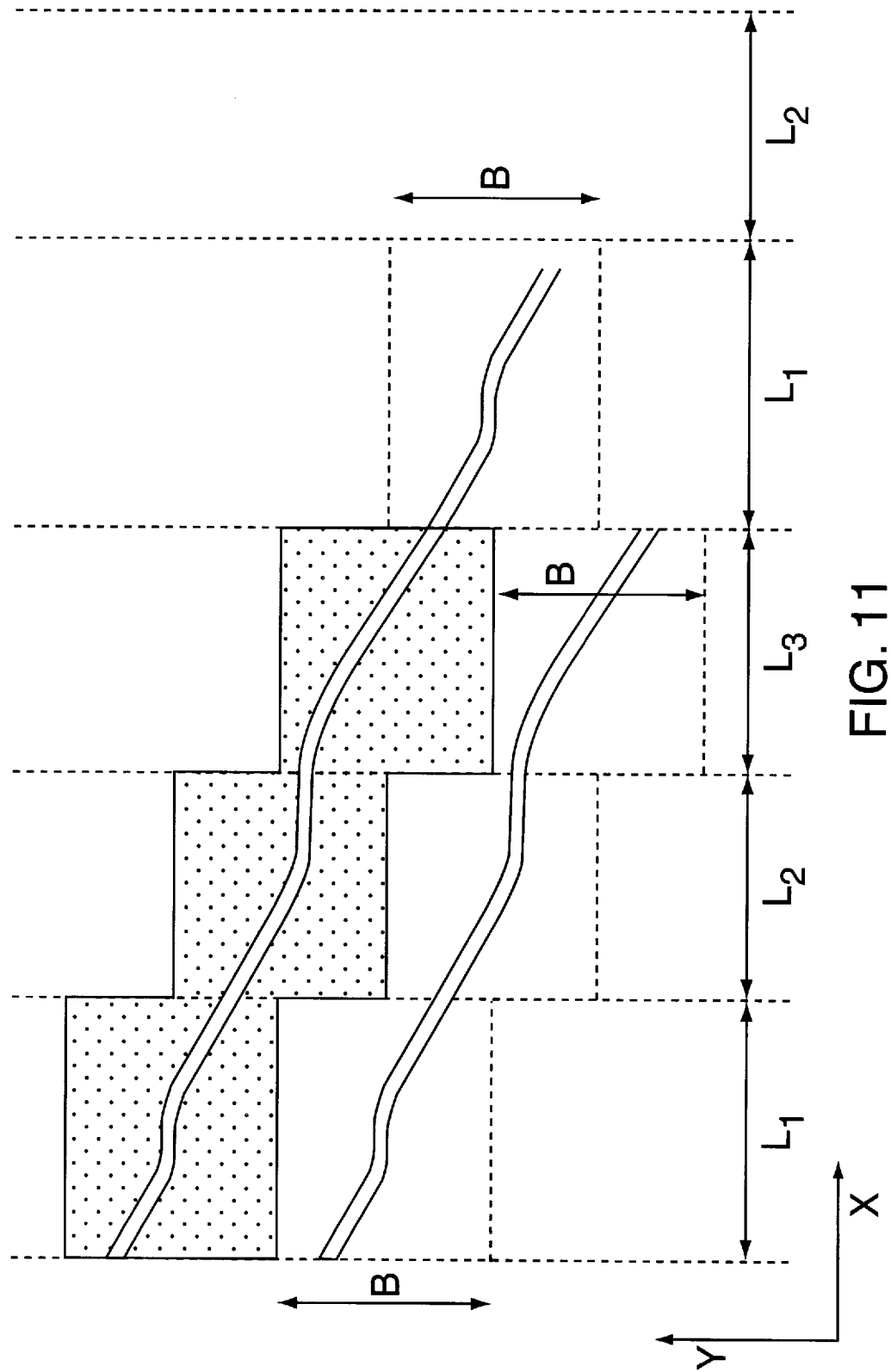
FIG. 11 shows an example of a unit cell containing three components, offset by degrees. The mathematical waveguide function is continuous and differentiable along the component boundaries (dashed lines)

FIGS. 9, 10, and 11 show examples in which the components must be separated by splitting first in the y direction, since an additional shift of the unit cell is required due to the shape of the waveguide. The mathematical waveguide function is continuous and differentiable along the component boundaries (dashed lines).

In FIG. 10, the unit cell includes six physically different components. The shift vectors are, for example, (x,y)=($L_1+L_2+L_3$, −a) or (x,y)=(0, −$B_1$−$B_2$), where a is the offset of the waveguide in the y direction between the left and right unit cell boundary (a=$y_1$−$y_2$).

Figure 12:
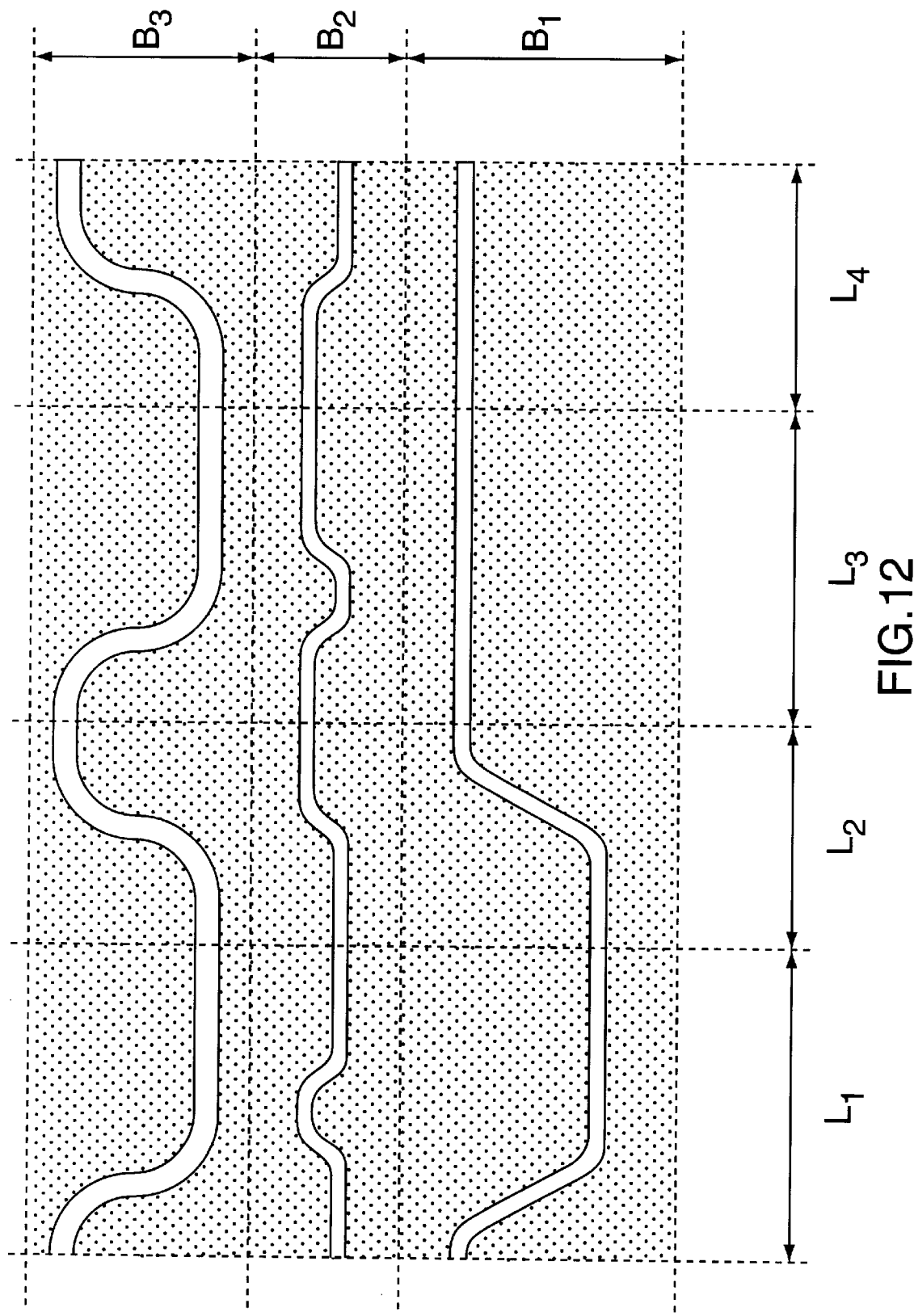
FIG. 12 shows an example of 12 individual components in the unit cell.
Figure 13:
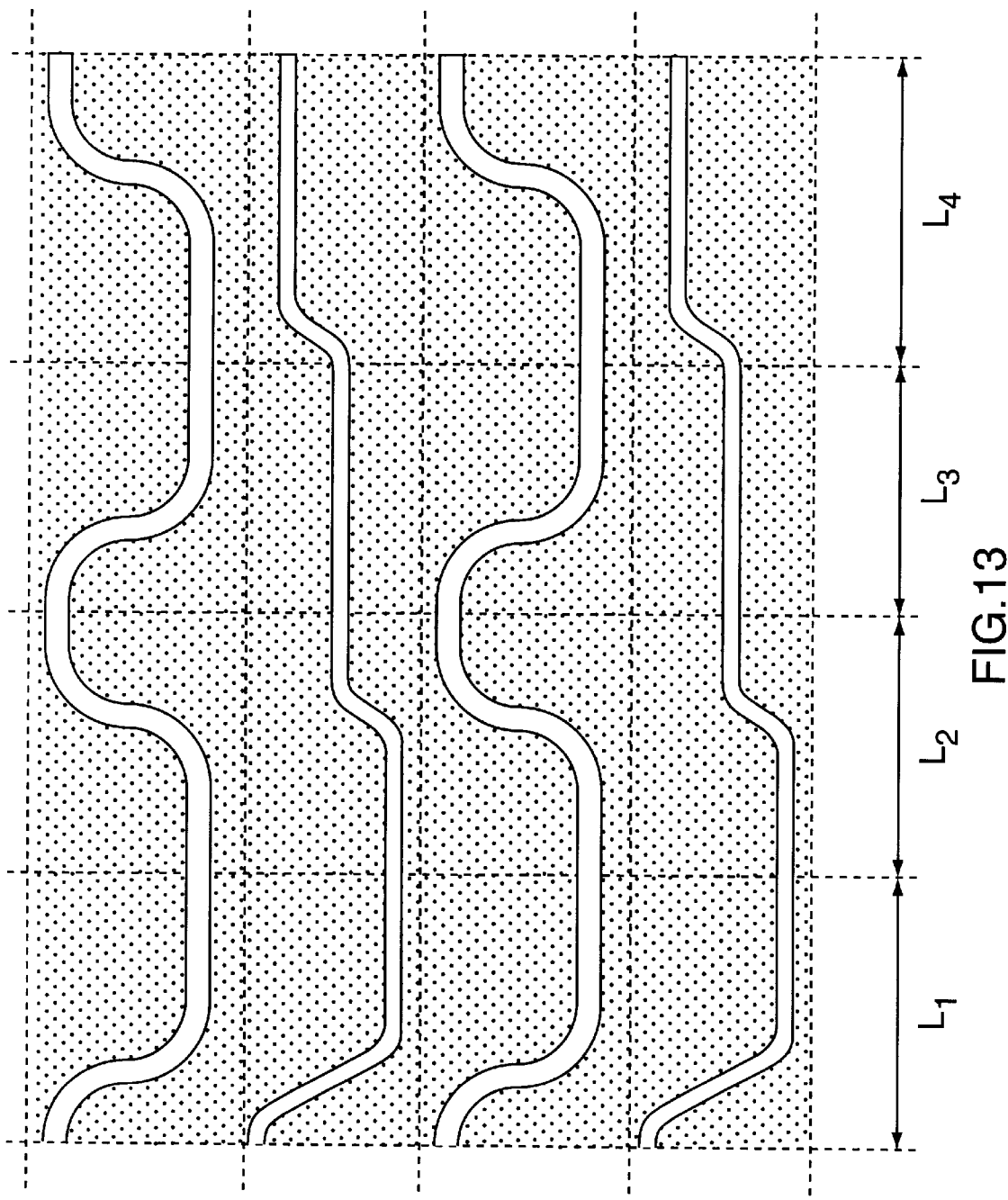
FIG. 13 shows an example of eight individual components in the unit cell.

FIGS. 12 and 13 show that many and very different components can be combined in a unit cell. FIG. 12 also shows components with straight waveguides. In FIG. 13, the possible shift vectors are, e.g., (x,y)=($L_1+L_2+L_3+L_4$, 0) or (x,y)=(0, −$B_1$−$B_2$) or ($L_1+L_2+L_3+L_4$,−$B_1$−$B_2$).

Figure 14A:
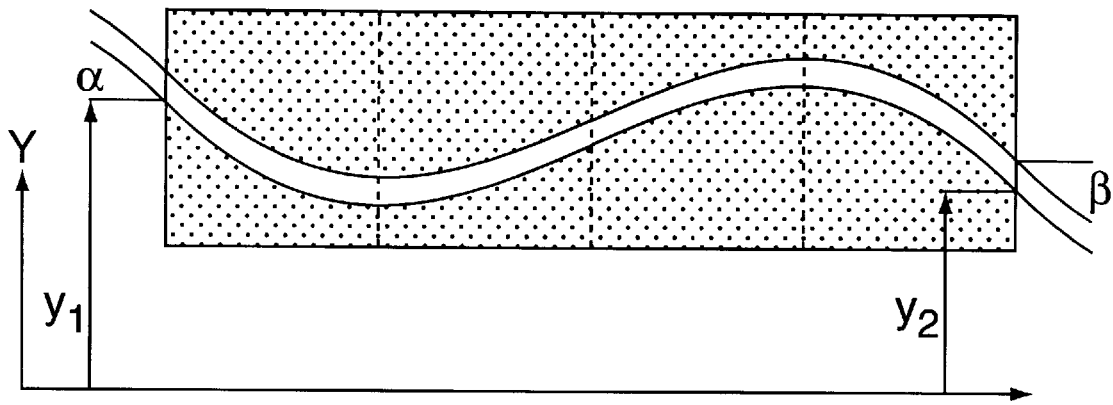
FIGS. 14a and 14b show a demonstration of the continuity and differentiability of the mathematical curvature function of the waveguide at the boundaries of the neighboring elementary cells.
Figure 14B:
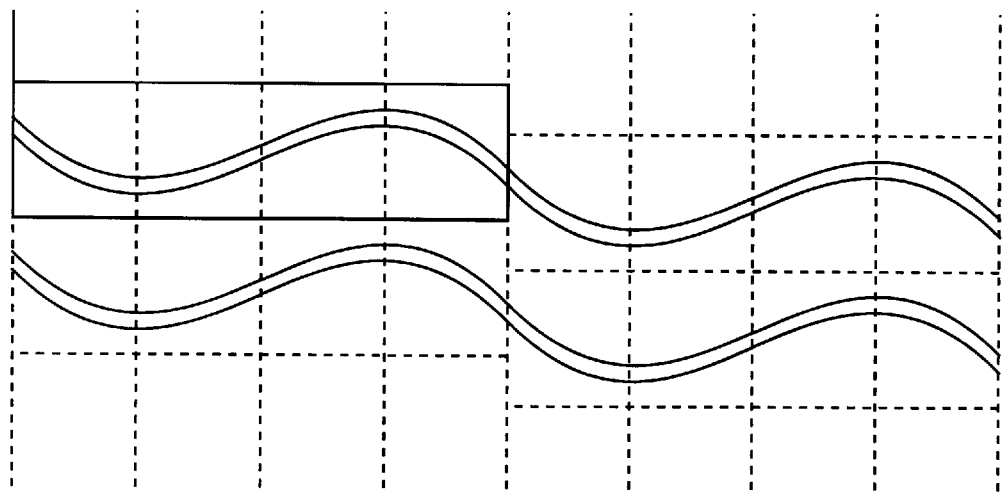

FIGS. 14a and 14b explain, using an example, that the waveguide must intersect the boundary line at the same angle on the left and right edge of the unit cell. Here this means that angles 60 and β are equal. The positions of the waveguides in the y direction do not need to coincide, i.e., $y_1$ can be different from $y_2$. The greater the difference between $y_1$ and $y_2$, the greater is the offset by degrees in the y direction, represented in FIG. 11, after the symmetry operations. The offset by degrees is calculated here from a=$y_1$−$y_2$.

Figure 15:
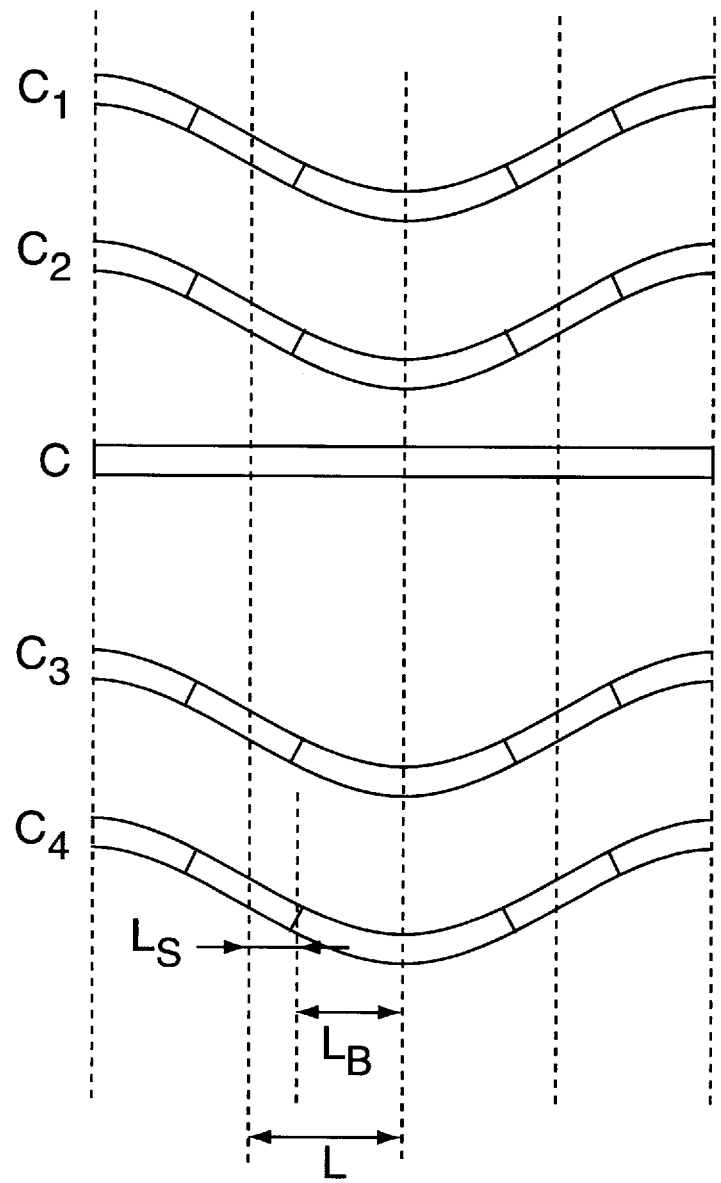
FIG. 15 shows an example of a combination of uncurved and curved partial waveguide sections.

FIG. 15 shows components with perfectly straight waveguides © and components with waveguides having both curved portions with length $L_B$ and straight portions with length $L_S$ ($C_1$, $C_2$, $C_3$, and $C_4$), where $L_S+L_B$=L. For waveguides $C_1$, $C_2$, $C_3$, and $C_4$, the mathematical symmetry operations used (mirroring and rotating of the original individual component) can be seen.

Although the method according to the present invention was explained using the manufacturing of a lithography mask set, it can also be used for structuring optoelectronic components with electron-beam lithography or ion-beam lithography. In these processes the structures for the optoelectronic components are obtained directly in one of the lacquer layers applied to the wafer.

In the above description and the drawings the following reference symbols are used: $C_1$, $C_2$, $C_3$, $C_4$, C are designations of individual waveguide sections; $L_1$, $L_2$, $L_3$, $L_4$, L are component lengths and $B_1$, $B_2$, $B_3$, $B_4$, B component widths; and x, y are spatial directions, $y_1$ being the position of the waveguide in the y direction on the left edge of the unit cell and $y_2$ being the position of the waveguide in the y direction on the right edge of the unit cell. Finally, a is the waveguide offset in the y direction between the left and right unit cell boundaries.

A computer may be used to help select the individual component patterns which are most suitable for the design of the individual cells from the constructed possible variants of individual component patterns. The computer also may be used for forming the unit cells with so as to have equal angles α and β, as well as for ensuring the mathematical continuity and differentiability of the curvature functions in the unit cells. The rotating and mirroring steps may be performed mathematically.

What is claimed is:

1. A method of optimizing the use of a base material in manufacturing optoelectronic components with variable-period grating, the optoelectronic components having edges corresponding to an x direction and a y direction, the method comprising the steps of:

choosing at least one individual component pattern, obtaining a first geometric variant of the at least one individual component pattern by performing a 180 degree rotation around an axis that is perpendicular to a surface of the individual component pattern and obtaining a second geometric variant of the at least one individual component pattern by mirroring; and creating a unit cell for forming a waveguide on the base material, the unit cell being formed from at least one of the first geometric variant, the second geometric variant and the at least one individual component pattern, the continuity and differentiability of the waveguide to be formed by the unit cell being ensured.

2. The method as recited in claim 1 wherein an incidence angle α of the waveguide on a left edge of the unit cell coincides with an exit angle β of the waveguide on a right edge of the unit cell.

3. The method as recited in claim 1 wherein a computer is used to select the individual component patterns.

4. The method as recited in claim 1 wherein a computer is used for generally ensuring the continuity and differentiability of the waveguide to be formed.

5. The method as recited in claim 1 further comprising the step of choosing a second individual component pattern.

6. The method as recited in claim 5 further comprising forming a further geometric variant by either mirroring or rotating the second component pattern.

7. The method as recited in claim 5 wherein the unit cell is created from at least the at least one individual component pattern, the first geometric variant, the second geometric variant and the second individual component pattern.

8. The method as recited in claim 1 wherein the continuity of the waveguide to be formed is slightly interrupted in at least one case, a lateral waveguide offset being less than ¹⁄₂₀ of a lateral width of the waveguide.

9. The method as recited in claim 1 wherein the differentiability of the waveguide to be formed is slightly interrupted in at least one case, the resulting angular offset still being less than 1°.

10. The method as recited in claim 1 wherein the unit cell is reproduced in at least one case by rotation around one of its axes.

11. The method as recited in claim 10 wherein the unit cell is reproduced to form a mask which generally covers the base material.

12. The method as recited in claim 1 wherein the unit cell is reproduced by translation using a shift vector.

13. The method as recited in claim 1 wherein a lateral position $y_1$ of the waveguide to be formed on a left edge of the unit cell is equal to a lateral position $y_2$ of the waveguide to be formed on a right edge of the unit cell.

14. The method as recited in claim 1 wherein a lateral position $y_1$ of the waveguide to be formed on a left edge of the unit cell is not equal to a lateral position $y_2$ of the waveguide to be formed on a right edge of the unit cell.

15. The method as recited in claim 1 the optoelectronic components are formed on the base material using electron or ion beam lithography.

16. The method as recited in claim 1 further comprising the step of reproducing the unit cell in the x and y directions.

17. The method as recited in claim 1 wherein the unit cell is created from at least two of the first geometric variant, the second geometric variant and the at least one individual component pattern.

18. A method of optimizing the use of a base material in manufacturing optoelectronic components with variable-period grating, the optoelectronic components having edges corresponding to an x direction and a y direction, the method comprising the steps of:

choosing at least one individual component pattern, obtaining a first geometric variant of the at least one individual component pattern by performing a 180 degree rotation around an axis that is perpendicular to a surface of the individual component pattern and obtaining a second geometric variant of the at least one individual component pattern by mirroring; and creating a unit cell for forming a waveguide on the base material, the unit cell being formed from at least one of the first geometric variant, the second geometric variant and the at least one individual component pattern, the continuity and differentiability of the waveguide to be formed by the unit cell being ensured;

wherein the at least one individual component pattern, the first geometric variant and the second geometric variant are used to obtain a set of masks for lithographic component manufacturing.

19. A method of optimizing the use of a base material in manufacturing optoelectronic components with variable-period grating, the optoelectronic components having edges corresponding to an x direction and a y direction, the method comprising the steps of:

rotating an original individual component pattern 180 degrees to form a rotated pattern;

mirroring the rotated pattern to form a mirrored pattern;

creating a unit cell from at least one of the original individual component pattern, the rotated pattern and the mirrored pattern the unit cell for forming a waveguide, the continuity and differentiability of the waveguide to be formed by the unit cell being ensured; and reproducing the unit cell to form a mask.

20. The method as recited in claim 19 further comprising the step of rotating the mirrored pattern by 180 degrees.

* * * * *

UNITED STATES PATENT AND TRADEMARK OFFICE
CERTIFICATE OF CORRECTION

PATENT NO. : 5,834,158
DATED : November 10, 1998
INVENTOR(S) : Hartmut Hillmer

It is certified that error appears in the above-identified patent and that said Letters Patent is hereby corrected as shown below:

Column 3, line 39, "$L_1$" should be -- $L_2$ --;

Column 5, line 28, "60" should be -- $\propto$ --;

Column 5, line 63, after "cells" delete "with"; and

Column 8, line 14, after "pattern" insert -- , --.

Signed and Sealed this

Twenty-first Day of September, 1999

Attest:

Q. TODD DICKINSON

*Attesting Officer*  *Acting Commissioner of Patents and Trademarks*

UNITED STATES PATENT AND TRADEMARK OFFICE
CERTIFICATE OF CORRECTION

PATENT No. : 5,834,158

DATED : November 10, 1998

INVENTOR(S): Hartmut Hillmer

It is certified that error appears in the above-identified patent and that said Letters Patent is hereby corrected as shown below:

Column 3, line 39, "$L_1$" should be -- $L_2$ --

Column 5, line 28, "60" should be -- $\propto$ --;

Column 5, line 63, after "cells" delete "with"; and

Column 8, line 14, after "pattern" insert -- , --.

Signed and Sealed this

Nineteenth Day of October, 1999

Attest:

Q. TODD DICKINSON

*Attesting Officer*

*Acting Commissioner of Patents and Trademarks*